United States Patent [19]

Nanbu et al.

[11] Patent Number: 4,727,265
[45] Date of Patent: Feb. 23, 1988

[54] SEMICONDUCTOR CIRCUIT HAVING A CURRENT SWITCH CIRCUIT WHICH IMPARTS A LATCH FUNCTION TO AN INPUT BUFFER FOR GENERATING HIGH AMPLITUDE SIGNALS

[75] Inventors: Hiroaki Nanbu, Hachioji; Noriyuki Honma, Kokubunji; Kunihiko Yamaguchi, Sayama; Kazuo Kanetani, Kokubunji; Goro Kitsukawa, Nishitama, all of Japan

[73] Assignee: Hitachi, Ltd., Tokyo, Japan

[21] Appl. No.: 755,910

[22] Filed: Jul. 17, 1985

[30] Foreign Application Priority Data

Jul. 20, 1984 [JP] Japan ................. 59-149370

[51] Int. Cl.$^4$ ................. H03K 17/16; H03K 19/092; H03K 19/00; H03L 5/00
[52] U.S. Cl. ................. 307/443; 307/264; 307/475; 307/480; 307/296 R
[58] Field of Search ............. 307/264, 360, 361, 480, 307/475, 443, 296 R, 473, 454, 455

[56] References Cited

U.S. PATENT DOCUMENTS 3,723,761 3/1973 Masaki ................. 307/443
3,778,646 12/1973 Masaki ................. 307/264

FOREIGN PATENT DOCUMENTS

0006536 1/1981 Japan ................. 307/443
0096425 6/1983 Japan ................. 307/475
0003227 1/1985 Japan ................. 307/475

Primary Examiner—Stanley D. Miller
Assistant Examiner—Trong Quang Phan
Attorney, Agent, or Firm—Antonelli, Terry & Wands

[57] ABSTRACT

A semiconductor circuit of a current mode type logic is provided having a reference voltage generating circuit which generates the reference voltage to be applied to the logic circuit in response to a clock signal to latch the state corresponding to an input signal at an instant of the clock signal input. The reference voltage has three levels in response to the voltage levels of the clock signal and the input signal: a middle voltage between the two high and low voltage levels of the input signal when the clock signal is at a first level voltage; a voltage higher than the high voltage level of the input signal when the clock signal is at a second level voltage and the output signal is at a high voltage; and a voltage lower than the low voltage level of the input signal when the clock signal is at a second level voltage and the output signal is at a second level voltage and the output signal is at a low voltage. This semiconductor circuit can relax restrictions on the signal amplitude due to the supply voltage and the saturation of the transistors, and, accordingly, allows processing signals having a much greater amplitude than was previously possible.

6 Claims, 18 Drawing Figures

SEMICONDUCTOR CIRCUIT HAVING A CURRENT SWITCH CIRCUIT WHICH IMPARTS A LATCH FUNCTION TO AN INPUT BUFFER FOR GENERATING HIGH AMPLITUDE SIGNALS

BACKGROUND OF THE INVENTION

The present invention relates to a semiconductor circuit having a current switch circuit and, more particularly, to a semiconductor circuit which includes a current switch circuit which imparts a latch function to an input buffer.

Figure 1:
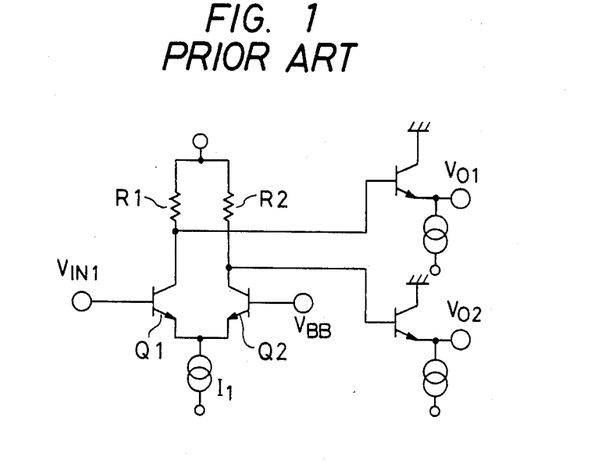
FIG. 1 is a circuit diagram showing the input buffer of the semiconductor memory of the prior art having a current switch circuit.
Figure 2:
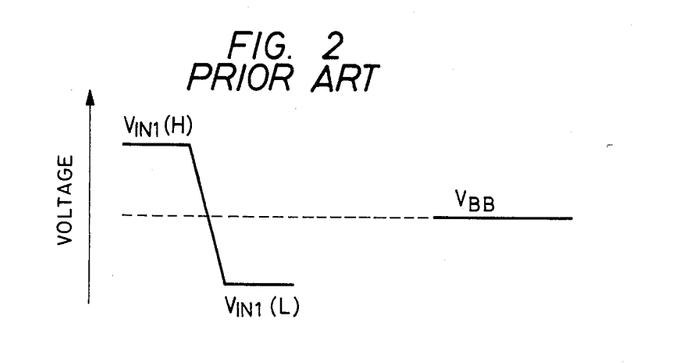
FIG. 2 is a diagram showing the relationship between the input signal voltage and the reference voltage of the circuit of the prior art.
Figure 3:
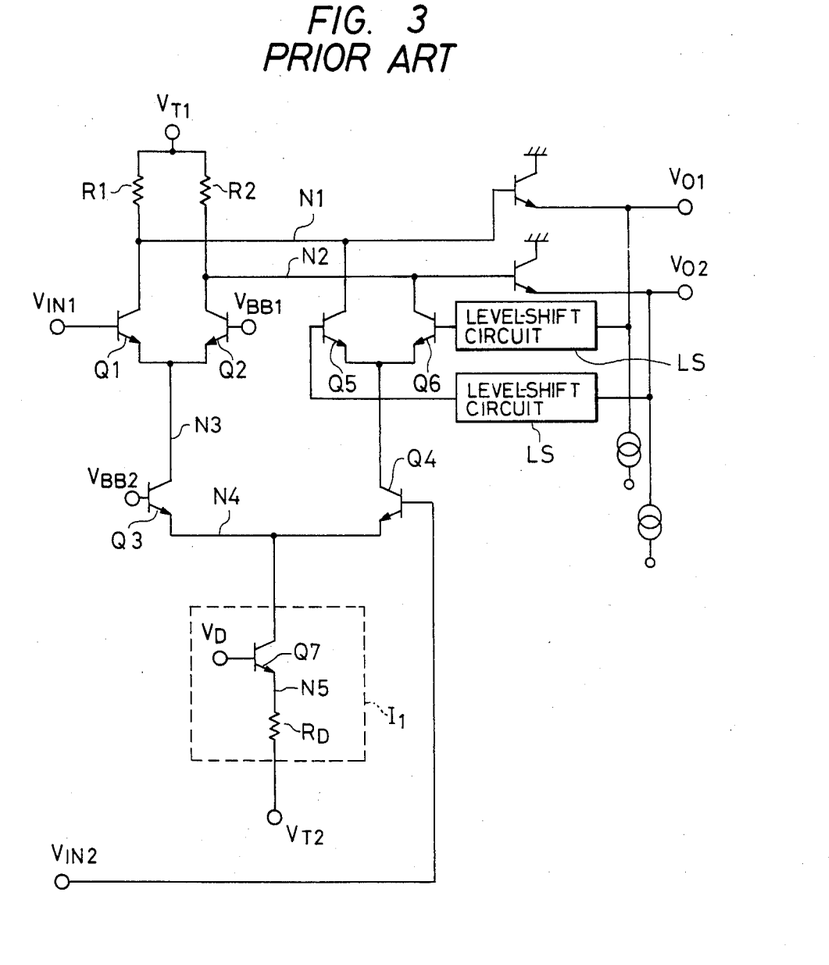
FIG. 3 is a circuit diagram showing the circuit which provides a latch function to the buffer of the prior art.

In the prior art, semiconductor devices frequently use current switch circuits for switching current paths in response to input signals. FIG. 1 shows the input buffer of a semiconductor memory device, which is frequently used in the prior art, and in which transistors Q1 and Q2, having their emitters commonly connected, form a current switch circuit. The levels of an input signal $V_{IN1}$ and a reference voltage $V_{BB}$ usually have such a relationship as is shown in FIG. 2. The current of a current source $I_1$ flows through the transistor Q1, when the input signal $V_{IN1}$ is high, $V_{IN1}(H)$, and through the transistor Q2 when the input signal $V_{IN1}$ is low, $V_{IN1}(L)$ Here, it is frequently necessary to give the input buffer such a latch function so as to receive an input signal only when a clock signal at a high or low voltage is fed from the system, as is disclosed in Japanese patent Laid-Open No. 58-222486, for example. FIG. 3 shows an example of the prior art, in which the input buffer serves as a latch. Here, the input signal is input to the position $V_{IN1}$ whereas the clock signal is input to the position $V_{IN2}$. In this example, the input signal $V_{IN1}$ is introduced when the clock signal $V_{IN2}$ is low. Next, the circuit operations of the prior art example shown in FIG. 3 will be briefly described. Now, if the clock signal $V_{IN2}$ is low, the current of the current source $I_1$ flows through a transistor Q3. At this time, the current of the current source $I_1$ flows through the transistor Q1 or Q2, depending upon whether the input signal $V_{IN1}$ is high or low, so that the output voltage $V_{01}$ goes low or high. Next, if the clock signal $V_{IN2}$ is high, the current of the current source $I_1$ flows through a transistor Q4. The transistor, Q5 or Q6, that current flows through is determined by the base voltage of the respective transistors at the high voltage. A suitably level-shifted voltage is applied by a level shift circuit LS to the bases of the transistors Q5 and Q6 from the output signals $V_{02}$ and $V_{01}$. Therefore, if the output signal $V_{01}$ is high when the voltage $V_{02}$ is low, current flows through the transistor Q6, and the output signal is held as it was in the previous state. That is, the output of the buffer does not depend upon the input signal $V_{IN1}$ when the clock signal $V_{IN2}$ is high.

If the latching function is effected by a series gate, as shown in FIG. 3, high-amplitude signals cannot be processed because of the restrictions imposed by supply voltage and by transistor saturation. This problem will now be described in detail with specific values in circuits.

To speed up signal processing, it is frequently necessary to set the voltage amplitudes of the aforementioned output signals $V_{01}$ and $V_{02}$ at 2.6 V or higher, for example.

Let us assume that the voltage amplitudes of the output signals $V_{01}$ and $V_{02}$ must be no less than 2.6 V. If, at this time, the power supply $V_{T1}$ is at 0 V, a node N1 or N2 is at $-2.6$ V. When the node N1 is at $-2.6$ V, the high voltage of the input signal $V_{IN1}$ must be $-2.6$ V or lower so that the transistor Q1 will not reach saturation. This is because a transistor must have its collector voltage higher than its base voltage in normal use so that it may not reach saturation. If the voltage amplitude of the input signal $V_{IN1}$ is at 0.4 V, its low voltage is $-3.0$ V so that the reference voltage is an intermediate value, $-2.8$ V. Hence, the node N3 is at $-3.6$ V if the transistor Q2 has a base-emitter voltage $V_{BE}$ at 0.8 V. As a result, a reference voltage $V_{BB2}$ must be $-3.6$ V or lower so that the transistor Q3 will not reach saturation. For this requirement, the node N4 is $-4.4$ V if the transistor Q3 has a base-emitter voltage $V_{BE}$ of 0.8 V. In other words, a supply voltage $V_D$ has to be at $-4.4$ V or lower so that a transistor Q7 will not reach saturation. A node N5 takes a voltage of $-5.2$ V if the transistor Q7 has a base-emitter voltage $V_{BE}$ of 0.8 V. Now, if the voltage to be applied to a resistor $R_D$ is 0.4 V, the power supply $V_{T2}$ must be no higher than $-5.6$ V. When this happens, the circuit shown in FIG. 3 cannot be used in a memory LSI which is usually used with a power supply of 5.2 V.

SUMMARY OF THE INVENTION

The present invention contemplates to eliminate the aforementioned difficulties of the prior art and aims to provide a semiconductor circuit with a current switch circuit which imparts a latch function to an input buffer to generate high amplitude signals.

To achieve this aim, the present invention provides a semiconductor circuit comprising a current switch circuit including: a first transistor having its base fed with an input signal taking two kinds of high and low voltages; a second transistor having its base fed with a reference voltage and its emitter connected with the emitter of the first transistor; a current source connected commonly with the emitter of the first transistor and the emitter of the second transistor; and a reference voltage generating circuit to generate the reference voltage which is to be applied to the base of the second transistor, wherein the improvement resides in that the reference voltage generating circuit generates three voltages: a middle voltage between the two high and low voltages which are applied to the base of the first transistor; a voltage higher than the higher one of the two high and low voltages; and a voltage lower than the lower one of the two high and low voltages. These voltages are generated in response to a clock signal. They latch the state corresponding to an input signal at the moment when the clock signal is input, so that the semiconductor circuit just described can relax restrictions on the signal amplitude due to the supply voltage and saturation of the transistors so as to process high-amplitude signals.

We have described a case in which the first and second transistors are bipolar, but these bipolar transistors may be replaced by field effect transistors. When this is done, the bases and the emitters in the above description should be changed to gates and sources, respectively.

DESCRIPTION OF THE PREFERRED EMBODIMENTS

Embodiment 1

Figure 4:
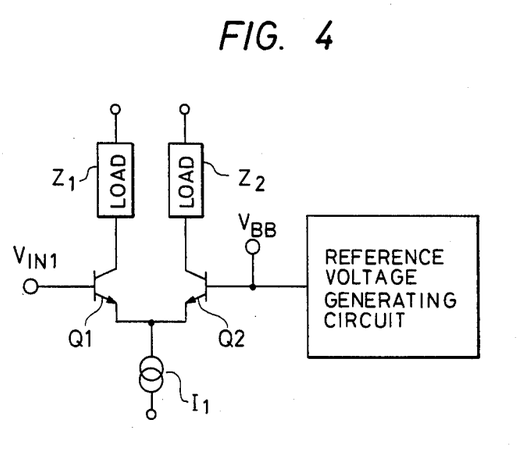
FIG. 4 is a circuit diagram showing a first embodiment for describing the fundamental concept of the present invention.
Figure 5:
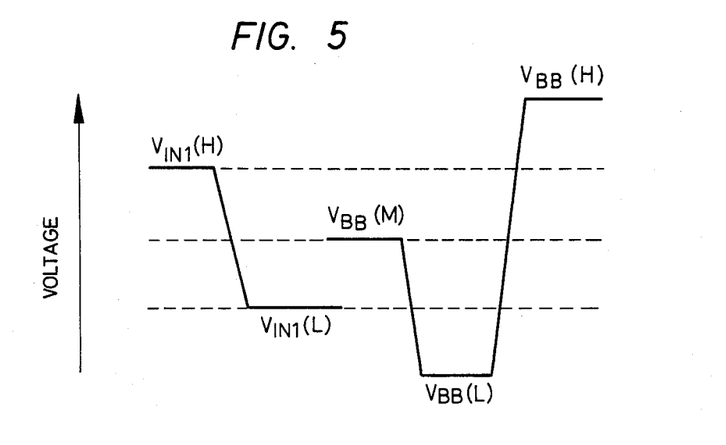
FIG. 5 is a diagram showing the level of a reference voltage in comparison with the level of the input signal.

In FIG. 4, a first transistor Q1 having its base fed with an input signal $V_{IN1}$ taking two kinds of high and low voltages and a second transistor Q2 having its base fed with a reference voltage $V_{BB}$ from a reference voltage generating circuit have their respective emitters connected to each other, their nodes connected to a current source $I_1$; and their collectors connected to loads $Z_1$ and $Z_2$, respectively. The level of the reference voltage $V_{BB}$, which is generated by the aforementioned reference voltage generating circuit, is shown in FIG. 5, as compared with the level of the input signal $V_{IN1}$. If this input signal $V_{IN1}$ is to be taken into the circuit shown in FIG. 4, the reference voltage generating circuit may generate a reference voltage $V_{BB}(M)$ which is midway between the high voltage $V_{IN1}(H)$ and the low voltage $V_{IN1}(L)$ of the input signal $V_{IN1}$. At this time, the transistor Q1 is turned on if the input signal $V_{IN1}$ is at the high voltage $V_{IN1}(H)$, as above, so that the current of the current source $I_1$ flows through the load $Z_1$, and the transistor Q2 is turned on, if the input signal $V_{IN1}$ is at the low voltage $V_{IN1}(L)$, so that the current of the current source $I_1$ flows through the load $Z_2$. In order that the circuit of FIG. 4 may not take in the input signal $V_{IN1}$, the reference voltage generating circuit may generate either a reference voltage $V_{BB}(L)$ lower than the low voltage $V_{IN1}(L)$ of the input signal $V_{IN1}$ or a reference voltage $V_{BB}(H)$ higher than the high voltage $V_{IN1}(H)$ of the input signal $V_{IN1}$. When this is done, the transistor Q1 or Q2 are always turned on without regard to the input signal $V_{IN1}$.

Embodiment 2

Figures 6, 7:
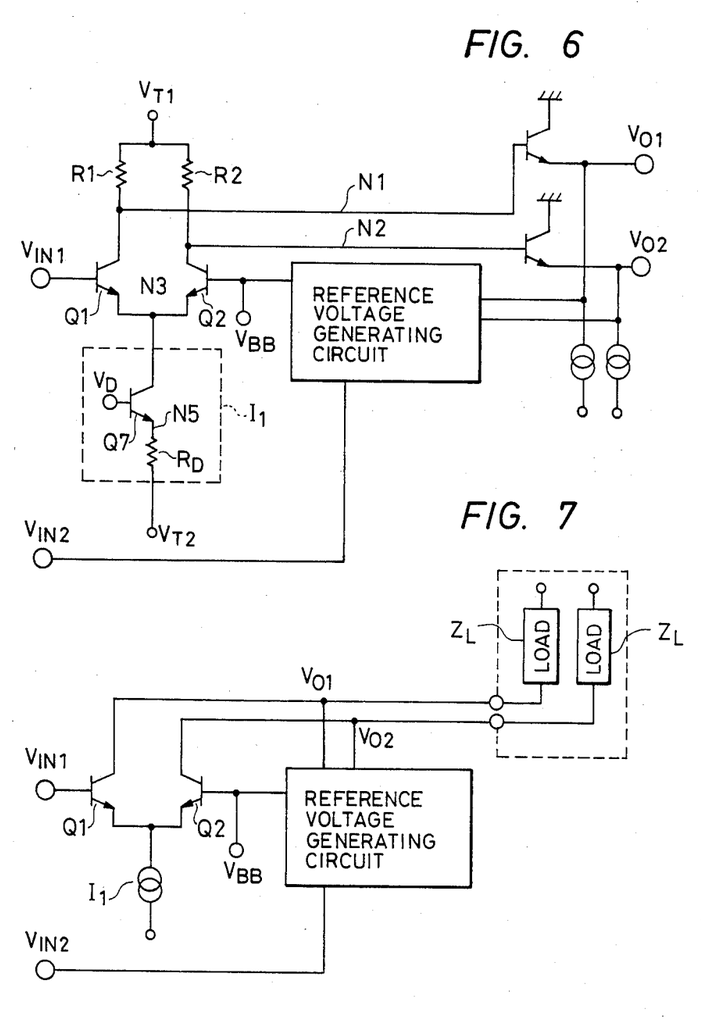
FIGS. 6, 7 and 8 are circuit diagrams showing second, third and fourth embodiments of the present invention, respectively.

FIG. 6 is a circuit diagram showing the second embodiment of the present invention, in which the input buffer of FIG. 1 is made to have a latch function by the present invention. In FIG. 6, the reference voltage generating circuit may be any circuit if it generates: a middle voltage between the high and low voltages of the input signal $V_{IN1}$ when a clock signal $V_{IN2}$ is at a low (or high) voltage; a voltage higher than the high voltage of the input signal $V_{IN1}$ when the clock signal $V_{IN2}$ is high (or low) and when an output signal $V_{01}$ is high; and the reference voltage $V_{BB}$ lower than the low voltage of the input signal $V_{IN1}$ when the clock signal $V_{IN2}$ is high (or low) and when the output signal $V_{01}$ is low. In this circuit, if the input signal $V_{IN1}$ is taken in, the clock signal $V_{IN2}$ may be low (or high). Since, at this time, the reference voltage generating circuit generates the reference voltage $V_{BB}(M)$ at a middle voltage between the high and low voltages of the input signal $V_{IN1}$, the current of the current source $I_1$ flows through a resistor R1, when the input signal $V_{IN1}$ is high, so that the output signal $V_{01}$ is low, and through a resistor R2, when the input signal $V_{IN1}$ is low, so that an output signal $V_{02}$ is low. If the input signal $V_{IN1}$ is not taken in, the clock signal $V_{IN2}$ may be high (or low). Since, at this time, the reference voltage generating circuit generates the reference voltage $V_{BB}$ higher than the high voltage of the input signal $V_{IN1}$ when the output signal $V_{01}$ is at the high voltage, the output signal $V_{01}$ is high regardless of whether the input signal $V_{IN1}$ is high or low. When the output signal $V_{01}$ is low, it is left at the low voltage without regard to the level of the input signal $V_{IN1}$. In this description, the clock signals have been assigned all to the voltage outside or all to that inside of parentheses.

Next, the circuit shown in FIG. 6 can be used with the memory LSI to be usually used with a power supply of 5.2 V, as will be described by enumerating specific numerical values, although the aforementioned circuit of the prior art shown in FIG. 3 can not be used with that memory LSI. In the circuit of FIG. 6, it is assumed that the output signals $V_{01}$ and $V_{02}$ are required to have a voltage amplitude of 2.6 V as in the aforementioned circuit of the prior art shown in FIG. 3. If the power supply $V_{T1}$ is at 0 V, the node N1 or N2 is at −2.6 V. If the node N2 is at −2.6 V, the high level of the reference voltage $V_{BB}$ must be at −2.6 V or lower so that the transistor Q2 will not reach saturation. If the input signal $V_{IN1}$ has a voltage amplitude of 0.4 V, the reference voltage $V_{BB}$ is required to have an amplitude of about 0.8 V so that its low voltage is −3.4 V and its middle voltage is −3.0 V so that the high voltage of the input signal $V_{IN1}$ is −2.8 V and the low voltage is −3.2 V. A node N3 is lowest when this voltage is determined from the low voltage of the input signal $V_{IN1}$. If the base-emitter voltage $V_{BE}$ of the transistor Q1 is assumed to be 0.8 V, the node N3 is −4.0 V. It follows that a supply $V_D$ has to be at −4.0 V or lower so that a transistor Q7 may not go to saturation. As a result, the node N5 is at −4.8 V if the transistor Q7 has its base-emitter voltage $V_{BE}$ of 0.8 V. Now, if the voltage to be applied to resistor $R_D$ is 0.4 V, the power supply $V_{T2}$ may be −5.2 V or less. In this case, therefore, the circuit shown in FIG. 6 can be used in the memory LSI, which is usually used with the 5.2 V power supply.

Embodiment 3

FIG. 7 is a circuit diagram showing the third embodiment of the present invention, in which the latch function is given in the present invention to circuit having non-linear load $Z_L$ (e.g., a circuit including a transistor, a diode or a resistor, for example) connected with the collector of the current switch circuit. No matter what non-linear circuit the load may be, generally speaking, a signal voltage appears at the collector of the circuit shown in FIG. 7, if the current is switched in the circuit. In the present embodiment, therefore, the signal voltage is detected so as to generate the reference voltage. A description similar to that made in the foregoing embodiment also holds for the circuit of FIG. 7. For example, the circuit of FIG. 7 can be used in the memory LSI or the like which is generally used with the power supply of 5.2 V, even if the voltage output signals $V_{01}$ and $V_{02}$ have a voltage amplitude of 2.6 V.

Embodiment 4

Figure 8:
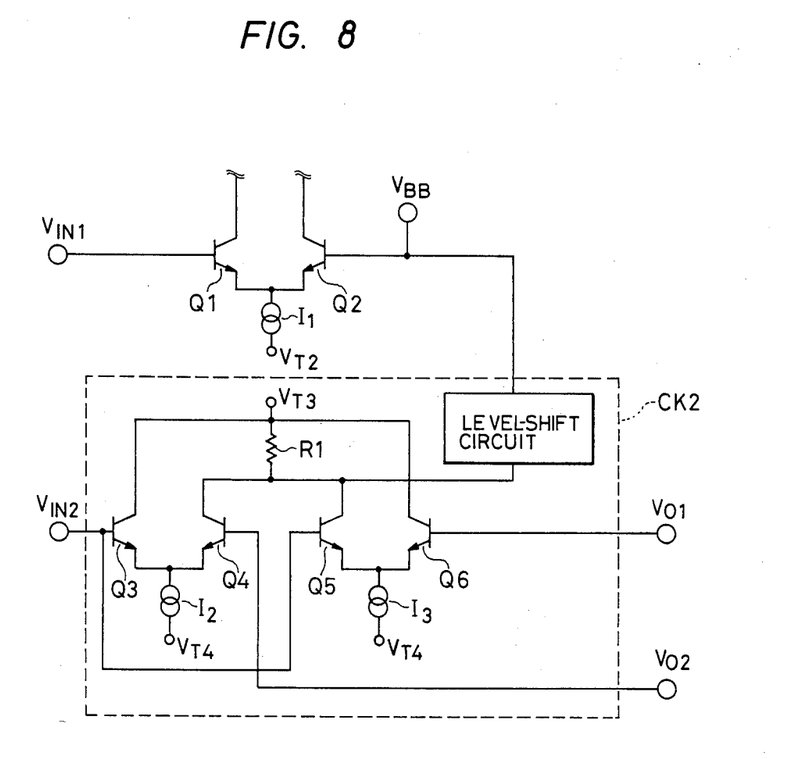
Figure 9:
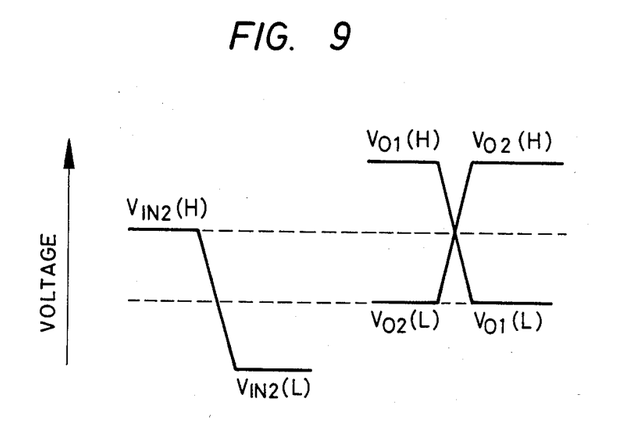
FIG. 9 is a diagram showing one example of a method for setting the voltage relationships of the fourth embodiment between the clock signal and the output signals.

FIG. 8 is a circuit diagram showing the fourth embodiment of the present invention and one method for realizing the reference voltage generating circuit in the second and third embodiments. In FIG. 8, the level-shift circuit in a reference voltage $V_{BB}$ generating circuit CK2 is provided to match the output of the circuit CK2 with the level of the input voltage $V_{IN1}$ and may be omitted unless necessary. In the aforementioned embodiment, the level of the reference voltage $V_{BB}$ is set so as to have relationship with the voltage of the input signal $V_{IN1}$ as is shown in FIG. 5. More specifically, if the level shift of the level-shift circuit in the reference voltage generating circuit CK2 of FIG. 8 is set to $V_S$, the reference voltage $V_{BB}$ in FIG. 5 has its high voltage $V_{BB}$ (H) expressed by $V_{T3}-V_S$, its middle voltage $V_{BB}$ (M) expressed by $V_{T3}-R1 \times I_2$ (or $I_3$)$-V_S$, and its low voltage $V_{BB}$ (L) expressed by $V_{T3}-R1 \times I_2-R1 \times I_3-V_S$. Hence, the reference voltage $V_{BB}$ can be set at an arbitrary level by changing the voltage $V_{T3}$, the resistance R1, the current $I_2$, the current $I_3$ and the level shift $V_S$. $V_{01}$ and $V_{02}$ indicate that the output signal voltages $V_{01}$ and $V_{02}$ of the second or third embodiment shown in FIG. 6 or 7 are applied. FIG. 9 is a diagram showing one example of a method for setting the voltage relationships of the fourth embodiment between the clock signal $V_{IN2}$ and the voltages of the output signals $V_{01}$ and $V_{02}$. In the circuit of FIG. 8 in this case, the clock signal $V_{IN2}$ may be set at the low voltage $V_{IN2}$(L), if it is intended to receive the input signal $V_{IN1}$, and at the high voltage $V_{IN2}$(H) it is not intended to receive the input signal $V_{IN1}$. At this time, whether Q1 or Q2 is turned on is not dependent upon the input signal $V_{IN1}$, but upon the level relationship of the output voltages $V_{01}$ and $V_{02}$.

Figure 10:
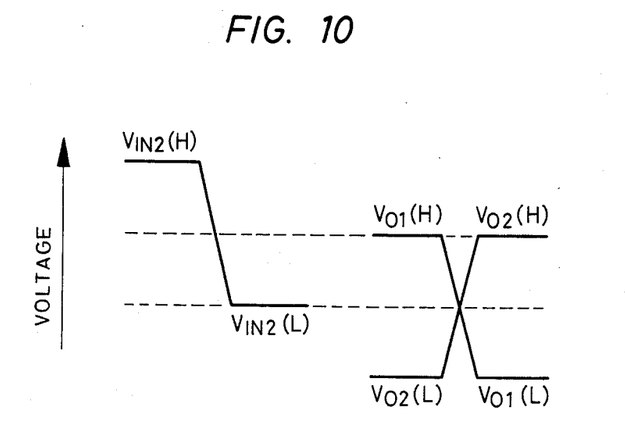
FIG. 10 is a diagram showing another example of the aforementioned signal voltage setting method.

FIG. 10 is a diagram showing another example of the method for setting the voltage relationship of the fourth embodiment shown in FIG. 8 between the clock signal $V_{IN2}$ and the output signals $V_{01}$ and $V_{02}$. In contrast to the example of FIG. 9, the clock signal $V_{IN2}$ may be set at the high voltage $V_{IN2}$(H) so as to receive the input signal $V_{IN1}$ but otherwise at the low voltage $V_{IN2}$(L) The reference voltage generating circuit CK2 of FIG. 8 is composed of bipolar transistors, all of which may be replaced by field effect transistors. In this modification, the bases, the emitters and the collectors are accordingly replaced by the gates, the sources and the drains, respectively.

Figure 18:
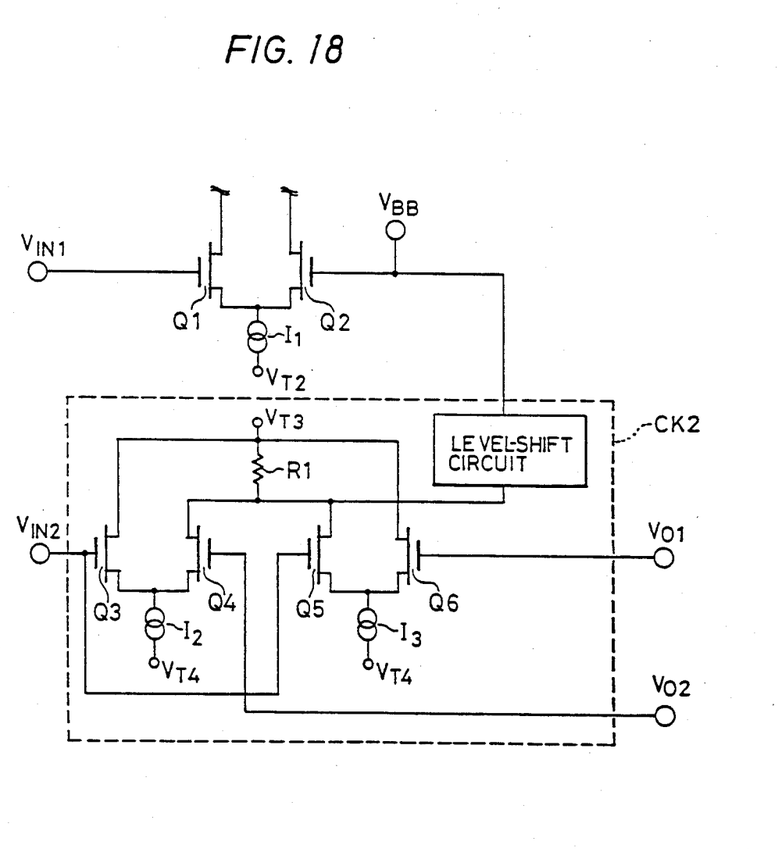
FIG. 18 is a circuit diagram showing a modification of the fourth embodiment (FIG. 8) of the present invention.

FIG. 18 is a circuit diagram showing a modification of the circuit shown by FIG. 8 wherein all of the bipolar transistors are replaced by field effect transistors.

Embodiment 5

Figure 11:
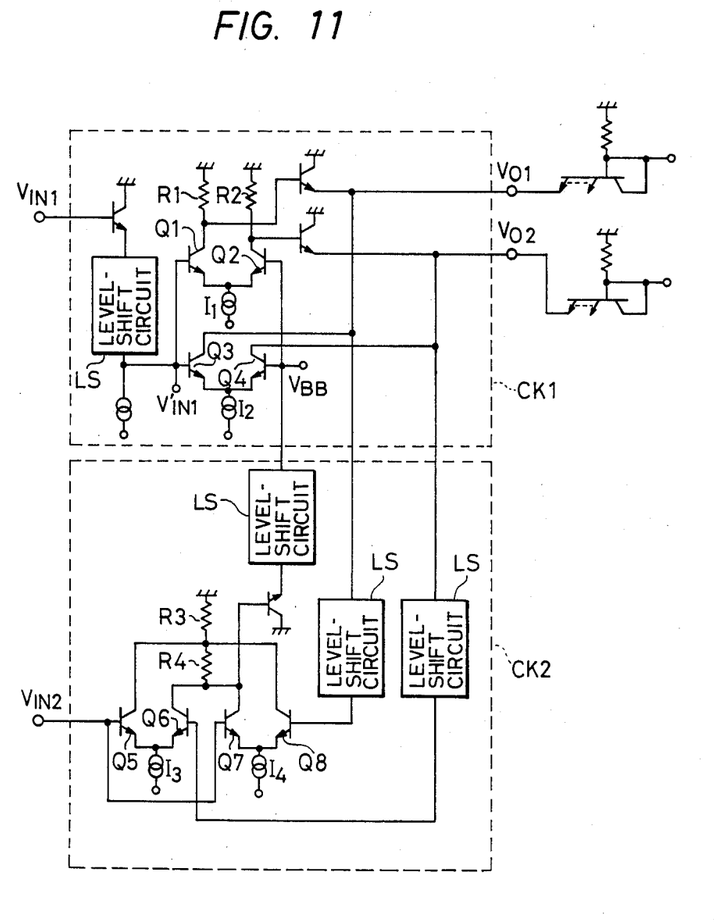
FIGS. 11, 12 and 13 are circuit diagrams showing fifth, sixth and seventh embodiments of the present invention, respectively.

FIG. 11 is a circuit diagram showing the fifth embodiment of the present invention, in which the present invention is applied to a buffer circuit CK1 in the buffer-decoder circuit of the memory LSI. FIG. 11 also shows a portion of a diode-decoder (see Japanese patent Laid-Open No. 53-97347). Here, LS in the buffer circuit CK1 and in the reference voltage $V_{BB}$ generating circuit CK2 indicates the level-shift circuits which may be any of the well-known type of single or combination of transistors, diodes, resistors and capacitors. In FIG. 11, the voltage relationship of a voltage $V'_{IN1}$ having its level shifted from the input signal $V_{IN1}$ with the reference voltage $V_{BB}$ is set, as shown in FIG. 5. The voltage relationship of the clock signal $V_{IN2}$ with the output voltages $V_{01}$ and $V_{02}$ may be set, as shown in FIG. 9 or 10. Now, let us assume that the voltage relationship between the clock signal $V_{IN2}$ and the output voltages $V_{01}$ and $V_{02}$ is set, as shown in FIG. 10. At this time, in order to take the input signal $V_{IN1}$ into the buffer circuit CK1, the clock signal $V_{IN2}$ may be set at the high voltage $V_{IN2}$ (H). Then, the transistors Q5 and Q7 are always turned on, and the current $I_3$ flows through a resistor R3 whereas the current $I_4$ flows through resistors R3 and R4 so that the reference voltage $V_{BB}$ takes its middle voltage $V_{BB}$(M). In order not to take the input signal $V_{IN1}$ into the buffer circuit CK1, the clock signal $V_{IN2}$ may be set at its low voltage $V_{IN2}$(L). For example, if the output signal $V_{01}$ is at its high voltage whereas the output signal $V_{02}$ is at its low voltage immediately before the clock signal $V_{IN2}$ is switched to its low voltage, the transistors Q5 and Q8 are tutned on when the clock signal $V_{IN2}$ is switched. As a result, the currents $I_3$ and $I_4$ flow through only the resistor R3, and the reference voltage $V_{BB}$ takes its high voltage $V_{BB}$(H) so that the output signals $V_{01}$ and $V_{02}$ are held at their respective high and low voltages.

Embodiment 6

Figure 12:
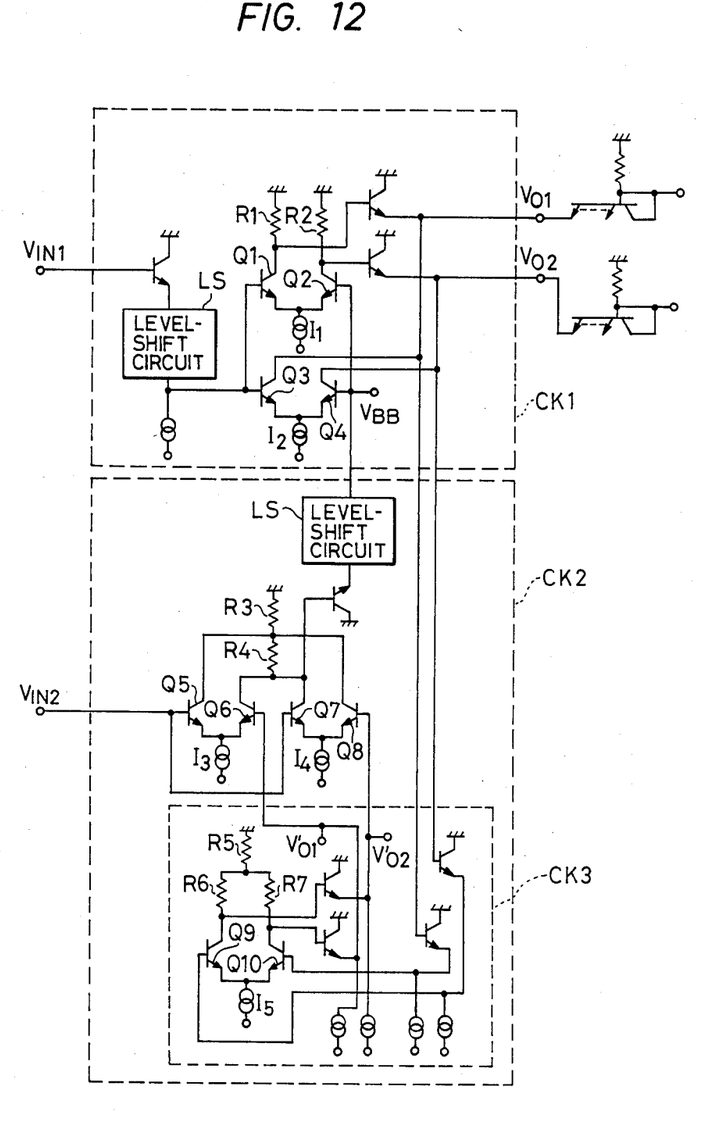

FIG. 12 shows the sixth embodiment of the present invention, which is different from the fifth embodiment shown in FIG. 11 only in the following point. In the fifth embodiment, the output signals $V_{01}$ and $V_{02}$ are applied directly to the respective bases of the transistors Q8 and Q6. In the sixth embodiment, the output signals $V_{01}$ and $V_{02}$ are applied through a buffer circuit CK3 to the bases of the transistors Q8 and Q6. If the buffer circuit CK3 is thus introduced, signals $V'_{01}$ and $V'_{02}$ to be applied to the transistors Q8 and Q6 can be arbitrarily set to desired levels by resistors R5, R6 and R7 and a current $I_5$.

Embodiment 7

Figure 13:
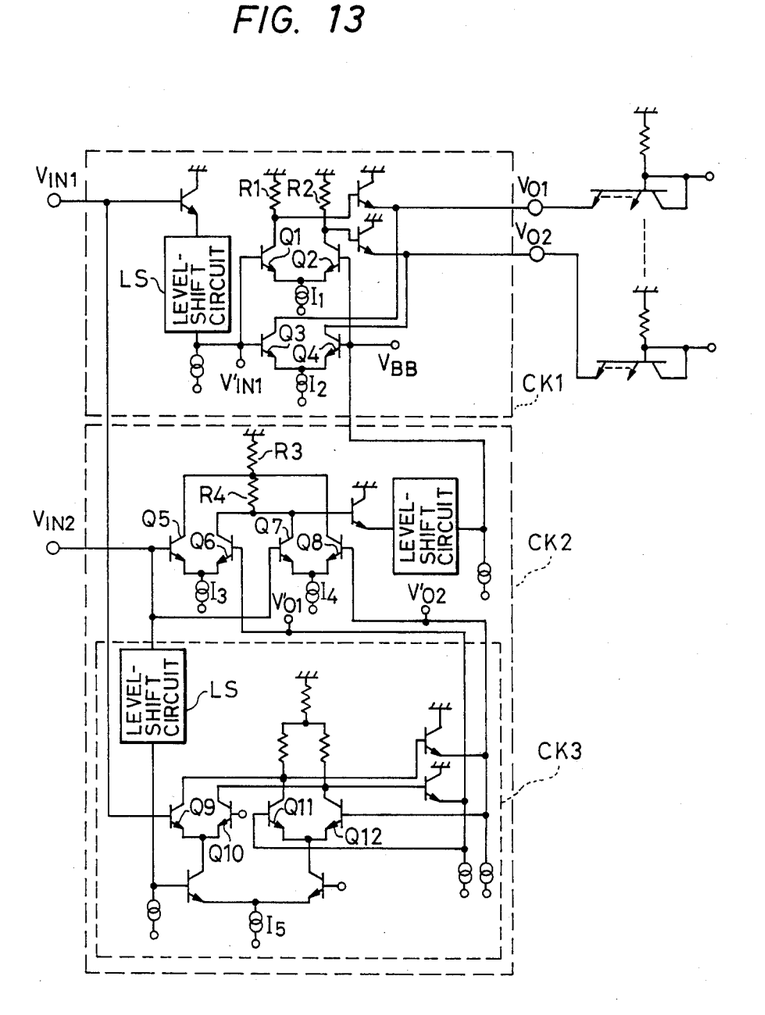

FIG. 13 shows the seventh embodiment of the present invention, which is different from the fifth embodiment shown in FIG. 11 and the sixth embodiment shown in FIG. 12 only in the following point that the signals $V'_{01}$ and $V'_{02}$ to be applied to the transistors Q6 and Q8 of the reference voltage generating circuit CK2 of the present embodiment are generated by the buffer circuit CK3 having the latch function shown in FIG. 3. Since the amplitude of the signals $V'_{01}$ and $V'_{02}$ is as low as 0.8 V, as has been described above, the aforementioned problem is not raised even if the aforementioned circuit of FIG. 3 is used.

Embodiment 8

Figure 14:
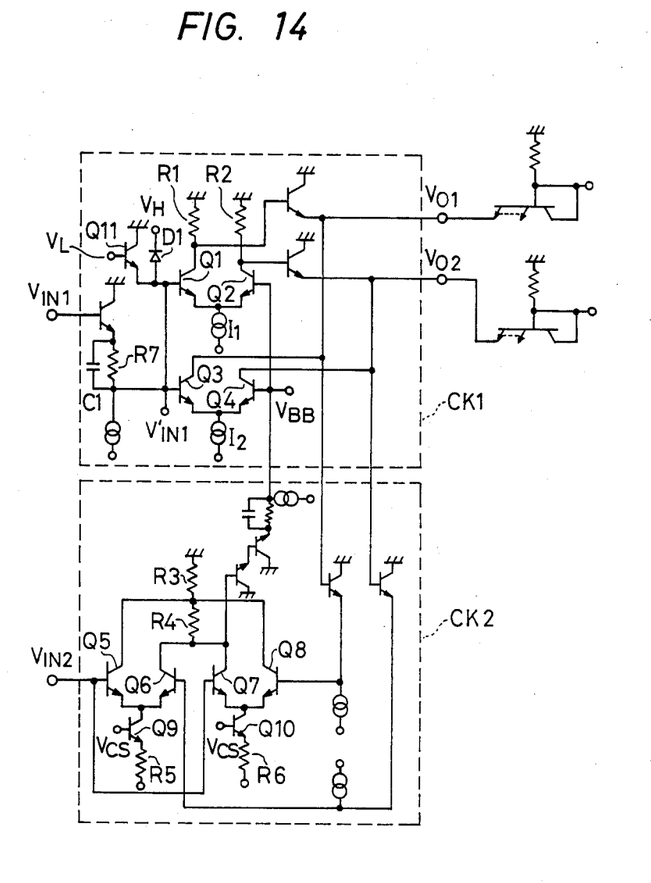
FIG. 14 is a circuit diagram showing an eighth embodiment of the present invention, in which the margin of operation of the buffer-decoder circuit in a memory LSI having a latch function is further augmented.
Figure 15:
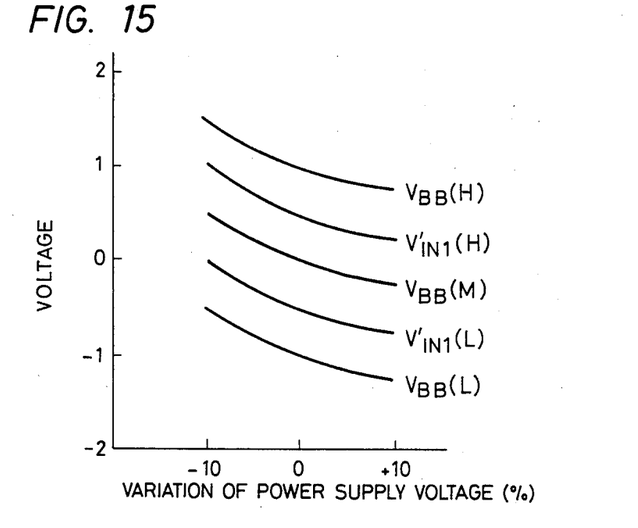
FIG. 15 is a diagram showing the reference voltage and the clamped input voltage, which have the same supply voltage dependency as that of the input signal level.
Figure 16:
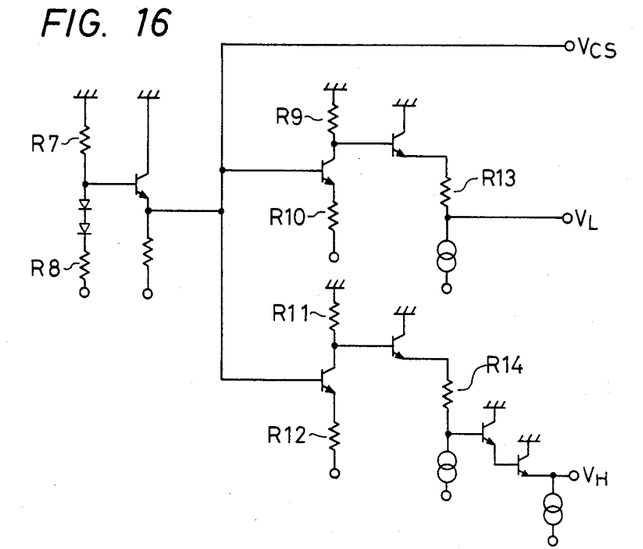
FIG. 16 is a circuit diagram showing one example in which the reference voltage and the clamped input voltage are made to have a desired supply voltage and a temperature dependency.

FIG. 14 shows the eighth embodiment of the present invention, in which the margin of operation of the buffer-decoder circuit in the memory LSI given the latch function in the present invention is further augmented. A diode D1 in the buffer circuit CK1 is provided to clamp the high voltage of the signal $V'_{IN1}$ which has its level shifted from the input signal $V_{IN1}$ by the resistor R7 and a capacitor C1, and a transistor Q11 is provided to clamp the low voltage of the signal $V'_{IN1}$. These clamp circuits operate so as to reduce the amplitude of the input signal $V_{IN1}$ (or $V'_{IN1}$) to such a low amplitude (0.4 V) as can drive a current switch composed of either the transistors Q1 and Q2 or transistors Q3 and Q4. Then, the transistors Q1 to Q4 and the respective transistors composing the current sources $I_1$ and $I_2$ are made resistant to saturation, as has been described above. Since, in the LSI memory, the level of the input signal $V_{IN1}$ (or $V'_{IN1}$) will change depending on the variation of the supply voltage and the temperature, the level of the middle voltage $V_{BB}(M)$ of the reference voltage $V_{BB}$ must depend on the supply voltage and the temperature. FIG. 15 shows as an example the level of the reference voltage $V_{BB}(M)$ which has a supply voltage dependency which satisfies the aforementioned requirement. Here, the high voltage $V'_{IN1}(H)$ and low voltage $V'_{IN1}(L)$ of the signal $V'_{IN1}$, and the high voltage $V_{BB}(H)$ and low voltage $V_{BB}(L)$ of the reference voltage $V_{BB}$ have to be in such a voltage relationship with the reference voltage $V_{BB}(M)$ as is shown in FIG. 5, so long as the supply voltage fluctuates within a certain range. To satisfy this condition without augmenting the signal amplitudes, the voltages $V'_{IN1}(H)$ and $V'_{IN1}(L)$, and $V_{BB}(H)$ and $V_{BB}(L)$ may be given the supply voltage dependencies similar to the aforementioned reference voltage $V_{BB}(M)$, as shown in FIG. 15. The voltage of the ordinate of FIG. 15 is normalized by the amplitude of the voltage $V'_{IN1}$. The conditions described above also hold true for the temperature relationship, and it is apparent that the voltages $V'_{IN1}$ and $V_{BB}$ may be assigned the same temperature relationship. FIG. 16 shows one example of the method for giving the desired dependencies upon the supply voltage and the temperature to the reference voltage $V_{BB}$ and the clamped input voltage $V'_{IN1}$. In FIG. 16, voltages $V_{CS}$, $V_L$ and $V_H$ are applied to the terminals $V_{CS}$, $V_L$ and $V_H$ of FIG. 14, respectively. In the following, specific numerical values are presented as an example in case the following relationship is required for both the dependency of the middle voltage $V_{BB}(M)$ of the reference voltage $V_{BB}$ upon a supply voltage $V_{EE}$ and the dependency upon the base-emitter voltage $V_{BE}$ of the transistor having the highest dependency upon the temperature:

$$V_{BB}(M)=(1-\alpha)V_{EE}+(1-2\alpha)V_{BE} \quad (1),$$

wherein $\alpha$ designates a constant.

Now, in FIG. 14, the voltage $V_{CS}$ is normally set at $-3.6$ V so that transistors Q9 and Q10 will not go to saturation. For this, it is set that R7/R8=3.50. The voltage $V_{CS}$ at this time has the following dependency:

$$V_{CS}=0.778V_{EE}+0.556V_{BE} \quad (2).$$

In order that the voltage differences between $V_{BB}(M)$, $V_{BB}(H)$ and $V_{BB}(L)$ may be normally set at 0.4 V, it is set in FIG. 14 that R4/R5=R4/R6=0.5. In order to set up the relation expressed by the equation (1) to the voltage $V_{BB}(M)$ under the conditions described above, values are set in the circuit of FIG. 14 so that $R3/R5=R3/R6=2.00-2.25\alpha$. At this time, the voltages $V_{BB}(H)$ and $V_{BB}(L)$ have a relationship similar to the equation (1). In order to set the voltage difference between $V'_{IN1}(L)$, $V'_{IN1}(H)$ and $V_{BB}(M)$ at 0.2 V and to set up a relationship similar to that in equation (1), it is sufficient to set $R9/R10=4.75-4.50\alpha$ and $R11/R12=4.25-4.50\alpha$. Resistors R13 and R14 are level-shift resistors which generate the same voltage as that of the resistor R7 of FIG. 14. The circuit shown in FIG. 16 is simply one example. Any conventional circuit that can ensure the desired dependencies upon supply voltage and the temperature may be used.

Figure 17:
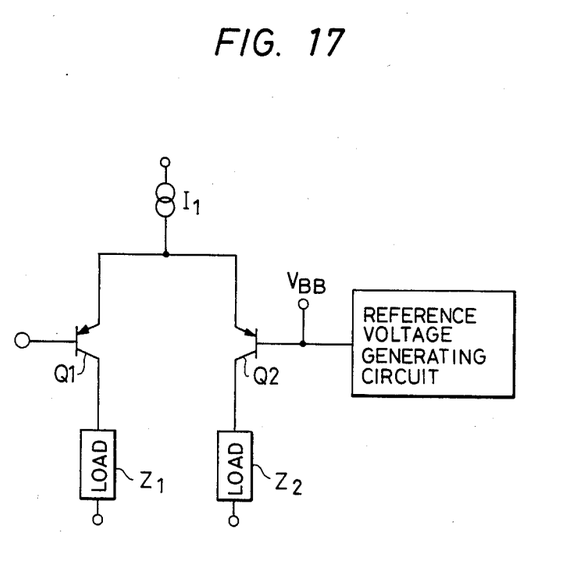
FIG. 17 is a circuit diagram showing an embodiment in which the present invention is applied to a current switch circuit composed of pnp transistors.

Although the description thus far made is related to the embodiments in which the present invention is applied to the current switch circuit composed of npn transistors, the present invention can be applied to a current switch circuit composed of pnp transistors such as is exemplified in FIG. 17. The present invention can also be applied to a similar circuit which uses FETs rather than bipolar transistors.

As has been described hereinbefore, according to the present invention, there can be provided a semiconductor circuit comprising a current switch circuit including: a first transistor having its base (or gate) fed with an input signal taking two kinds of high and low voltages; a second transistor having its base (or gate) fed with a reference voltage and its emitter (or source) connected with the emitter (or source) of said first transistor; a current source connected commonly with the emitter (or soruce) of said first transistor and the emitter (or source) of said second transistor; and a reference voltage generating circuit for generating the reference voltage which is to be applied to the base (or gate) of said second transistor, wherein the improvement resides in that said reference voltage generating circuit has functions to generate three kinds of voltages; a middle voltage between the two high and low voltages which are to be applied to the base (or gate) of said first transistor; a voltage higher than the higher one of said two high and low voltages; and a voltage lower than the lower one of said two high and low voltages in response to a clock signal and to latch the state corresponding to an input signal at an instant when said clock signal is input. As a result, the current switch circuit can impart the latch function to the input buffer to generate high amplitude signals, so as to differ from the prior art in which high amplitude signals (2.6 V or higher) cannot be processed by the restrictions on the supply voltage and the saturation of the transistors.

In the foregoing Figures: Q1 designates the first transistor; Q2 the second transistor; $V_{IN1}$ the input signal; $V_{IN2}$ the clock signal; $V_{BB}$ the reference voltage; $V'_{IN1}$ the voltage having the level shifted from the input signal; $V_{O1}$ and $V_{O2}$ the output voltages; $I_1$ the current source; LS the level-shift circuit; CK1 the buffer circuit; CK2 the reference voltage generating circuit; and CK3 the buffer circuit.

Obviously many modifications and variations of the present invention are possible in the light of the above teachings. It is therefore to be understood that within the scope of the appended claims the invention may be practiced otherwise than as specifically described.

What is claimed is:

1. A semiconductor circuit comprising a current switch circuit including:
   a first transistor having its base fed with an input signal having a high voltage level and a low voltage level, said first transistor generating an output signal at its collector;
   a second transistor having its base fed with a reference voltage and its emitter connected with the emitter of said first transistor;
   a current source connected commonly with the emitter of said first transistor and the emitter of said second transistor; and
   a reference voltage generating circuit having first and second input terminals fed with a clock signal and said output signal, repectively, and an output terminal generating said reference voltage which is applied to the base of said second transistor,
   wherein said reference voltage generating circuit includes means to generate three kinds of voltages: a middle voltage which is intermediate between the high voltage level and the low voltage level of the input signal when said clock signal is at a first voltage level; a voltage higher than the high voltage level of the input signal when said clock signal has a second voltage level and when an output signal of said semiconductor circuit is at a high voltage level; and a voltage lower than the low voltage level of the input signal when said clock signal is at the second voltage and when said output signal is at a low voltage, whereby said reference voltage generator operates said current switch circuit in response to said input signal and said clock signal to latch the state corresponding to an input signal at an instant when said clock signal is input.

2. A semiconductor cirucit according to claim 1, wherein said semiconductor circuit includes means to generate first and second output signals in accordane with the operation of said current switch circuit, wherein the high and low voltage levels of said first and second output signals are inverted from one another, and further wherein said reference voltage generating circuit includes: a third transistor having its base fed with the clock signal; a fourth transistor having its base fed with the first output signal and its emitter connected with the emitter of said third transistor; a fifth transistor having its base connected with the base of said third transistor and fed with said clock signal; a sixth transistor having its base fed with the second output signal and its emitter connected with the emitter of said fifth transistor; a current source connected commonly with the emitters of said third and fourth transistors; and a current source connected commonly with the emitters of said fifth and sixth transistors, wherein said fourth and fifth transistors having their collectors connected with each other, wherein said third and sixth transistors have their collectors connected with each other, wherein a resistor having one terminal connected commonly with the collectors of said fourth and fifth transistors has its other terminal connected commonly with the collectors of said third and sixth transistors, and wherein said reference voltage is generated at the connected collectors of said fourth and fifth transistors.

3. A semiconductor circuit according to claim 2, wherein said reference voltage generating circuit generates said reference voltage through a level-shift circuit from the connected collectors of said fourth and fifth transistors.

4. A semiconductor circuit comprising a current switch circuit including:
   a first transistor having its gate fed with an input signal having a high voltage level and a lower voltage level, said first transistor generating an output signal at its drain;
   a second transistor having its gate fed with a reference voltage and its source connected with the source of said first transistor;
   a current source connected commonly with the source of said first transistor and the source of said second transistor; and
   a reference voltage generating circuit having first and second input terminals fed with a clock signal and said output signal, resepectively, and an output terminal generating said reference voltage which is applied to the gate of said second transistor,
   wherein said reference voltage generating circuit includes means to generate three kinds of voltages: a middle voltage which is intermediate between the high voltage level and the low voltage level of the input signal when said clock signal is at a first voltage level; a voltage higher than the high voltage level of the input signal when said clock signal has a second voltage level and when an output signal of said semiconductor circuit is at a high voltage level; and voltage lower than the low voltage level of the input signal when said clock signal is at the second voltage and when said output signal is at a low voltage, whereby said reference voltage generator operates said current switch circuit in response to said input signal and said clock signal to latch the state corresponding to an input signal at an instant when said clock signal is input.

5. A semiconductor circuit according to claim 4, wherein said semiconductor circuit includes means to generate first and second output signals in accordance with the operation of said current switch circuit, wherein the high and low voltage levels of said first and seocnd output signals are inverted from one another, and further wherein said reference voltage generating circuit includes: a third transistor having its gate fed with the clock signal; a fourth transistor having its gate fed with the first output signal and its source connected with the source of said third transistor; a fifth transistor having its gate connected with the gate of said third transistor and fed with said clock signal; a sixth transistor having its gate fed with the second output signal and its source connected with the source of said fifth transistor; a current source connected commonly with the sources of said third and fourth transistors; and a current source connected commonly with the sources of said fifth and sixth transistors, wherein said fourth and fifth transistors having their grains connected with each other, wherein said third and sixth transistors have their drains connected with each other, wherein a resistor having one terminal connected commonly with the drains of said fourth and fifth transistors has its other terminal connected commonly with the drains of said third and sixth transistors, and wherein said reference voltage is generated at the connected drains of said fourth and fifth transistors.

6. A semoconductor circuit according to claim 5, wherein said reference voltage generating circuit generates said reference voltage through a level-shift circuit from the connected drains of said fourth and fifth transistors.

* * * * *